United States Patent
Roine

(10) Patent No.: US 9,419,591 B2
(45) Date of Patent: Aug. 16, 2016

(54) CONTROLLABLE WIDE FREQUENCY RANGE OSCILLATOR

(71) Applicant: TEXAS INSTRUMENTS INCORPORATED, Dallas, TX (US)

(72) Inventor: Per Torstein Roine, Oslo (NO)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/581,183

(22) Filed: Dec. 23, 2014

(65) Prior Publication Data

US 2016/0182021 A1   Jun. 23, 2016

(51) Int. Cl.
*H03K 3/03* (2006.01)
(52) U.S. Cl.
CPC .................................. *H03K 3/0315* (2013.01)
(58) Field of Classification Search
CPC .................................................... H03K 3/0315

USPC ................... 331/36 C, 57, 135, 177 R, 185
See application file for complete search history.

(56) References Cited

U.S. PATENT DOCUMENTS

| 7,808,295 B2* | 10/2010 | Sakiyama ............ H03K 3/0315 327/115 |
| 2010/0271140 A1* | 10/2010 | Raghunathan ............ H03L 7/22 331/34 |
| 2013/0222072 A1* | 8/2013 | Van Den Boom .............. H03K 19/01855 331/57 |

* cited by examiner

*Primary Examiner* — Richard Tan
(74) *Attorney, Agent, or Firm* — Lawrence J. Bassuk; Frank D. Cimino

(57) ABSTRACT

A circuit includes a ring oscillator that includes a plurality of delay stages coupled in series to generate an output frequency for the ring oscillator. A capacitive array is operatively coupled between a supply rail and a power rail for each of the delay stages to supply power to the delay stages. The capacitive array selectively adjusts the output frequency of the ring oscillator via a capacitive setting of the capacitive array.

15 Claims, 4 Drawing Sheets

CONTROLLABLE WIDE FREQUENCY RANGE OSCILLATOR

TECHNICAL FIELD

This disclosure relates to integrated circuits, and more particularly to a controllable wide frequency range oscillator that can be employed in analog switching applications.

BACKGROUND

In many analog switching applications, output load, frequency, and regulation conditions can vary dramatically within a given application. Such applications can include direct current (DC)/DC switching converters, and switching analog to digital converters (ADC) for example. With such applications and others, there is often a need for many orders of magnitude of load current variation and associated signal bandwidth operating over a wide range of frequencies to support such variation. However, most analog circuits cannot operate over more than a couple orders of magnitude variation without changing circuit topologies to accommodate load/bandwidth conditions. For example, some attempts at providing large load and signal bandwidth include dynamic switching between different circuit topologies for low-power and high-power operating modes operating at different frequencies depending on mode. These topologies, however, increase circuit complexity, and yield variation in performance (e.g., offset, noise) between modes.

SUMMARY

This disclosure relates to a controllable wide frequency range oscillator. In one example, a circuit includes a ring oscillator that includes a plurality of delay stages coupled in series to generate an output frequency for the ring oscillator. A capacitive array is operatively coupled between a supply rail and a power rail for each of the delay stages to supply power to the delay stages. The capacitive array selectively adjusts the output frequency of the ring oscillator via a capacitive setting of the capacitive array.

In another example, a circuit includes a ring oscillator that includes a plurality of delay stages coupled in series to generate an output frequency at a respective output of each of the delay stages. A capacitive array is selectively switched between a supply rail and a power rail for each of the delay stages to supply power to the delay stages. The capacitive array provides adjustment to a plurality of capacitors in the capacitive array based on a selection command. A controller selectively adjusts the output frequency of the ring oscillator by controlling the selection command to adjust the plurality of capacitors in the capacitive array.

In yet another example, a circuit includes a ring oscillator that includes a plurality of delay stages coupled in series to generate an output frequency for the ring oscillator. A capacitive array is selectively switched between a supply rail and a power rail for each of the delay stages to supply power to the delay stages. The capacitive array adjusts the output frequency of the ring oscillator via a capacitive setting of the capacitive array. A level shifter includes a plurality of switches operatively coupled to a respective output of each of the delay stages. The level shifter increases a rise time and a transition level for the respective output of each of the delay stages.

DETAILED DESCRIPTION

This disclosure relates to a controllable wide frequency range oscillator that can be employed in analog switching applications. A dynamically adaptable ring oscillator circuit can operate over more than a 1:1000 frequency range with current utilized by the oscillator proportional to its respective operating frequency. This can be achieved by using a capacitive array operating as an equivalent conductance to power the ring oscillator, where the switching frequency is derived from the ring oscillator itself. The capacitive array configuration provides positive feedback, since oscillator bias current supplied by the array is proportional to the oscillator switching frequency, and vice versa. Frequency regulation is performed by selecting (e.g., digital adjustment command) the amount of capacitance switched in each oscillator stage. The capacitance adjustment can be performed in a controller feedback loop monitoring a clocked comparator or similar analog switching circuit. This maintains frequency proportional to the "analog activity rate" (e.g., switching rate in case of a DC/DC converter), where the oversampling rate of the converter can be held substantially constant by dynamically adjusting the capacitive array based on sensed load switching conditions. Thus, the ring oscillator circuit described herein tracks analog activity rate and current consumption, and provides oscillator output to drive clocked comparators (or similar circuits) that can be utilized to replace ultra-low-power analog complexity by digital logic.

Figure 1:
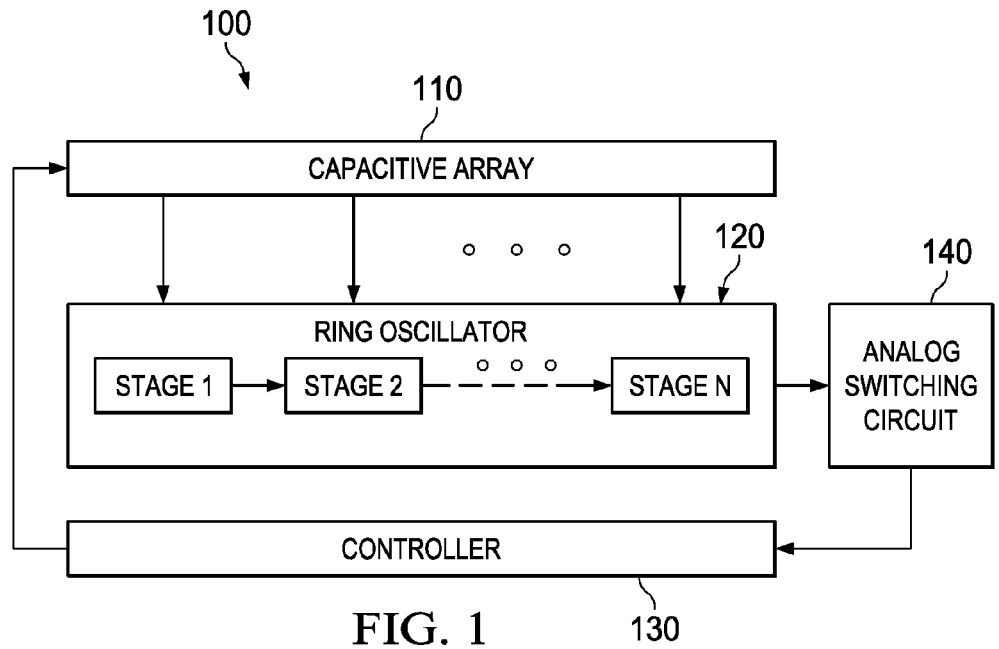
FIG. 1 illustrates an example of a circuit that employs a capacitive array and a ring oscillator to provide scalable frequency and power in the circuit.

FIG. 1 illustrates an example of a circuit 100 that employs a capacitive array 110 and a ring oscillator 120 to provide scalable frequency and power in the circuit. As used herein, the term circuit can include a collection of active and/or passive elements that perform a circuit function such as a processing circuit or logic circuit, for example. The term circuit can also include an integrated circuit where all the circuit elements are fabricated on a common substrate, for example. The ring oscillator 120 is configured as a plurality of stages (also referred to as delay stage) shown as stage 1 though stage N (See e.g., FIG. 2). The operating frequency of the ring oscillator 120 is controlled in part by the number of stages 1 though N and the configuration of the capacitive array 110. The capacitive array 110 can be configured to provide a configurable capacitor that is operatively coupled to the power rail of each stage 1 though N. The capacitive array 110 can be a linear array of parallel capacitors where the amount of capacitance is selected via a selection command (e.g., digital code) supplied to the array which specifies more or less capacitors are connected in parallel within the array to form a given capacitor.

The capacitive array 110 can be configured between a supply rail (e.g., VDD) and a power rail connected to each of the delay stages to supply power to the delay stages. As will be illustrated and described below with respect to FIG. 2, after the capacitive array 110 has been configured, analog switches which are operated via the ring oscillator output frequency can charge and discharge the selected capacitance of the capacitance array to control the operating frequency of the ring oscillator and thus provided positive feedback described herein.

A controller 130 can configure each capacitor in the capacitive array 110 via a digital code selection command for example. In one example, the controller 130 can monitor an activity rate in an analog switching circuit 140 and configure the capacitors in the capacitive array 110 according to the activity level of the circuit. As used herein, the term activity rate refers to the number of analog events monitored per a given time frame (e.g., per second). For example, if the ring oscillator were set to a frequency of 100 khz, and a DC/DC converter was supplying a 10 ma load, the activity rate would be the number of times per second a monitoring comparator comparing load conditions to a voltage threshold indicated that the converter needed to switch a switching inductor to maintain the voltage in regulation. If the load were to change, the number of events (e.g., number of requests per time period to maintain the load) would increase which can be subsequently detected by the controller 130. The controller 130 could then command an increase in ring oscillator frequency to track the change in detected load conditions to provide an increased oversampling rate to the analog switching circuit 140.

If the analog switching circuit 140 were a clocked comparator for example, the controller 130 could configure less capacitance if the switching frequency of the comparator were low in order to lower the ring oscillator 110 frequency and conserve overall power in the circuit 100. If the activity level of the analog switching circuit were to increase, the capacitor values in the capacitive array 110 can be increased by the controller to consequently increase the operating frequency of the ring oscillator 120. The analog switching circuit 140 can be substantially any analog switching circuit. Such circuits include clocked comparators, DC/DC converters, analog to digital converters (ADC), digital to analog converters (DAC), and linear dropout regulators (LDO), for example.

By controlling the capacitance values in the capacitive array 110, a dynamically adaptable ring oscillator 120 can be provided and operate over more than a 1:1000 frequency range with current utilized by the oscillator proportional to its respective operating frequency. This can be achieved by configuring the capacitive array 110 operating as an equivalent conductance to power the ring oscillator 120, where the switching frequency is derived from the ring oscillator itself. The capacitive array 110 provides positive feedback, since oscillator bias current supplied by the capacitive array is proportional to the oscillator switching frequency, and vice versa. Frequency regulation is performed by adjusting via the controller 130 the amount of capacitance switched in each oscillator stage. The capacitance adjustment can be performed in the controller 130 feedback loop monitoring a clocked comparator or similar analog switching circuit 140, for example. This maintains frequency proportional to the "analog activity rate" (e.g., switching rate in example of a DC/DC converter), where the oversampling rate of the converter can be held substantially constant by dynamically adjusting the capacitive array 110 and ring oscillator frequency based on sensed load switching conditions. The ring oscillator 120 and controller 130 can track analog activity rate and current consumption, and provide oscillator output to drive analog switching circuits 140 that can be utilized to replace ultra-low-power analog complexity by digital logic.

By utilizing the capacitive array 110 configuration where switches (See e.g., FIG. 2) coupling the array to the oscillator are also are clocked by the ring oscillator 120, a wide range of frequency and quiescent current can be achieved—without additional employment of analog components such as current branches, mirrors or amplifiers, for example. With five stages in the ring oscillator 120, for example, a level shifter circuit (See. e.g., FIG. 5) can be used to level shift the ring oscillator outputs to full swing, and arbitrarily enhance the slew rate, while mitigating the potential for short-circuit currents via timing between stages. Similarly, non-overlapping capacitance charge/discharge switch control can be used to avoid any unintended current paths (e.g., to reach kHz frequencies at a few nA quiescent current).

The ring oscillator 120 can typically be embedded into an analog module, for example, together with a clocked comparator and a digital state machine providing the controller frequency feedback. This combination can replace a continuous time comparator, but with quiescent current that automatically scales with "analog activity", from ≈5 nA at 500 Hz bandwidth up to ≈10 uA at 10 MHz bandwidth, for example. Since the clocked comparator has the same operating conditions regardless of the clock frequency, the comparator noise and offset is independent of the bandwidth and quiescent current. In a DC/DC converter application, this combination of oscillator, capacitive array, and controller, can enable >90% efficiency over a wide range of output load current (e.g., 0.5 uA to 100 mA load current).

Figure 2:
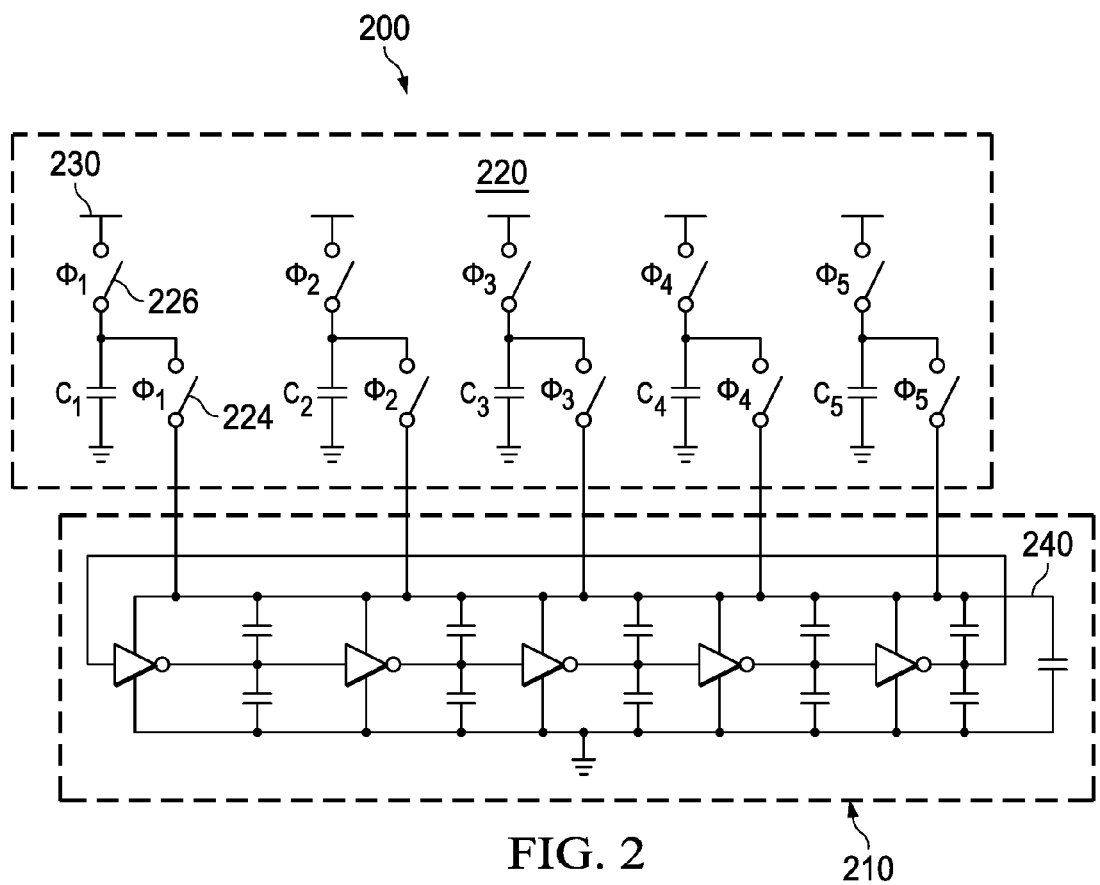
FIG. 2 illustrates an example circuit of a ring oscillator and capacitive array.

FIG. 2 illustrates an example circuit 200 having a ring oscillator 210 and capacitive array 220. The ring oscillator 220 in this example includes five inverter stages although more or less than five stages are possible. The output of each stage feeds the input to the succeeding stage with the output from the last stage feeding the first stage in the loop. Output from each stage in the ring oscillator 210 generates five phase and complimentary phase clocks shown as $\phi1$, $\phi2$, $\phi3$, $\phi4$, and $\phi5$ along with their compliment phases. Each phase clock controls a switch (e.g., switch 224 and 226) which is applied to the capacitive array 220 which charges and discharges configurable capacitors in the array shown as C1 though C5 in this example. The capacitors C1-C5 are connected between a supply rail 230 and a power rail 240 supplying power to each of the stages. Although one capacitor C1 though C5 is shown configured for each stage and between supply and power rails, more or less than five capacitors can be configured. In some examples, a single capacitor (or subset) could be selected and configured between the supply rail 230 and the power rail 240.

Each capacitor can be isolated in its own separate array or provided as part of a larger array housing the collective capacitors of C1 through C5. As will be illustrated and described below with respect to FIGS. 4 through 9, a level shifting circuit can be added to the output of the ring oscillator 210 to both increase the rise and fall time of the oscillator output and to increase the output voltage levels of the clock output signals (e.g., increase the difference between the high and low states of the oscillator outputs).

By utilizing the configurable circuit 200, a large frequency tuning range can be achieved by configuration of the capacitive array 220. This can be achieved since the equivalent resistance given by configured capacitor in the array and switching frequency provides positive feedback as the frequency changes. Also, no analog bias currents or reference voltages need to be maintained in the circuit 200 since digitally controlled capacitors and switches are used to bias the ring oscillator 210. As noted previously, the circuit 200 allows the use of clocked comparators having substantially constant performance over wide range of bandwidth and current, for example. Thus, clock frequency in associated analog switching circuits can be adjusted according to the circuit activity rate which allows for conservation of power. Consequently, analog circuit quiescent current can be scaled with the required bandwidth via controlled adjustment of the capacitance values in the capacitive array 220.

Figure 3:
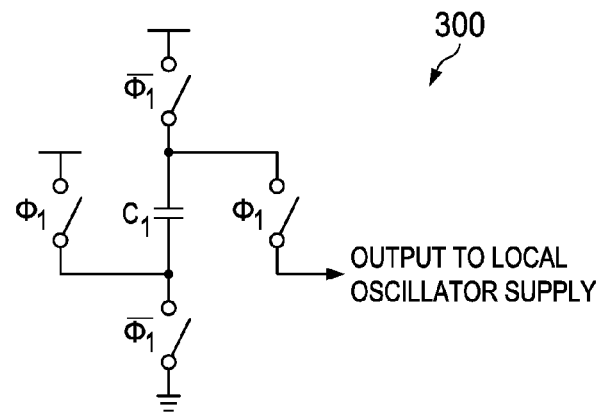
FIG. 3 illustrates an example of a voltage doubling configuration for a capacitive array.

FIG. 3 illustrates an example of a circuit 300 providing a voltage doubling configuration for a capacitive array. The circuit 300 illustrates a voltage doubling configuration of the capacitive array depicted in FIG. 2. In this example, each capacitor is switched via four switches as opposed to the double-switching configuration shown in FIG. 2. Similarly, two phase clocks are employed yet in this example, one phase clock φ1 drives two switches with respect to C1 and its complimentary clock drives the other two switches with respect to C1. For purposes of brevity, only C1 from FIG. 2 is shown in its respective doubling configuration however each capacitor C2-C4 can be similarly configured as C1 shown in FIG. 3.

Figure 4:
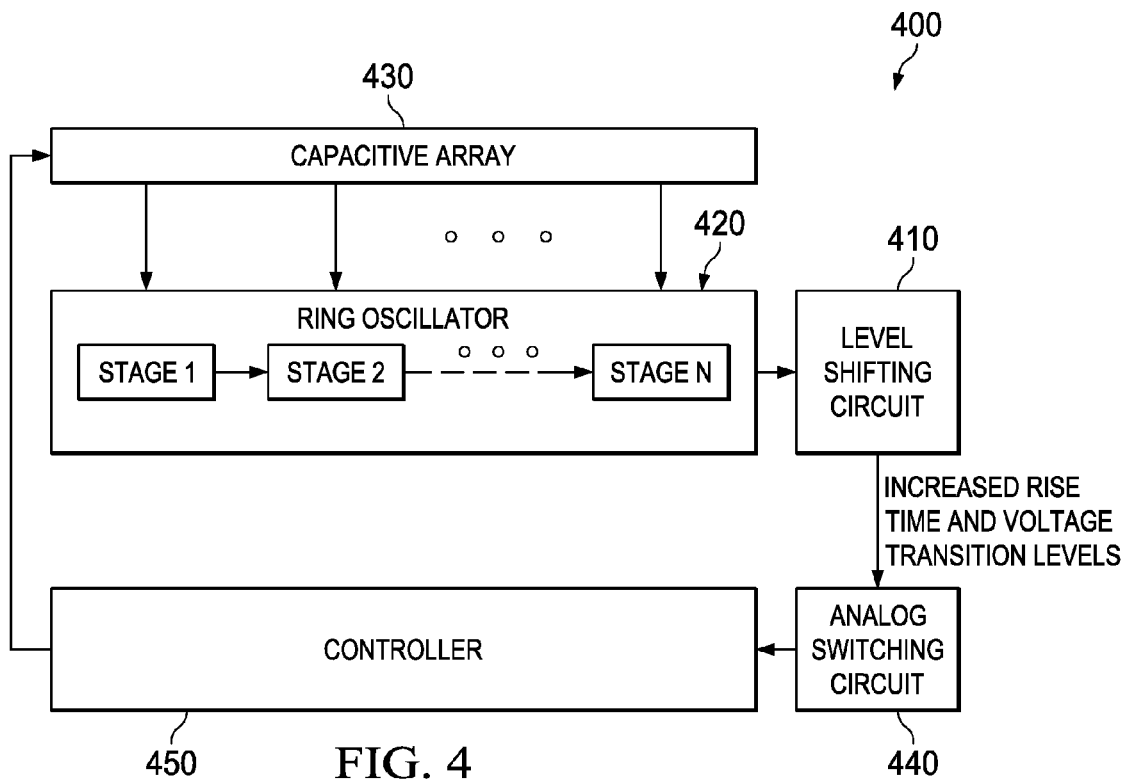
FIG. 4 illustrates an example of a level shifting circuit that can be employed with a ring oscillator and capacitive array.

FIG. 4 illustrates an example of a circuit 400 providing a level shifting circuit 410 that can be employed with a ring oscillator 420 and capacitive array 430. Output from the ring oscillator 420 can be conditioned via the level shifting circuit 410. Such conditioning includes increasing the rise time and fall time of each (or subset) of the respective frequency outputs from each stage of the ring oscillator 420. Conditioning also includes increasing the voltage transition levels of the frequency output(s) of the ring oscillator 420, where transition levels are defined as the difference between the high and low state of the ring oscillator outputs. By providing signal level shifting and conditioning as described herein, subsequent circuits such as analog switching circuits can operate more efficiently by receiving faster voltage transitions and operate with higher noise margins due to higher voltage transition levels.

After signal level shifting as described herein, output from the level shifting circuit 410 can be provided to an analog switching circuit 440 which is monitored via a controller 450 to control the ring oscillator frequency based on the monitored activity rate. As noted previously, ring oscillator frequency can be controlled by adjusting the amount of capacitance in the capacitive array 430 (e.g., via digital code selection from controller). Example level shifters and waveforms are illustrated and described below with respect to FIGS. 5 though 9.

Figure 5:
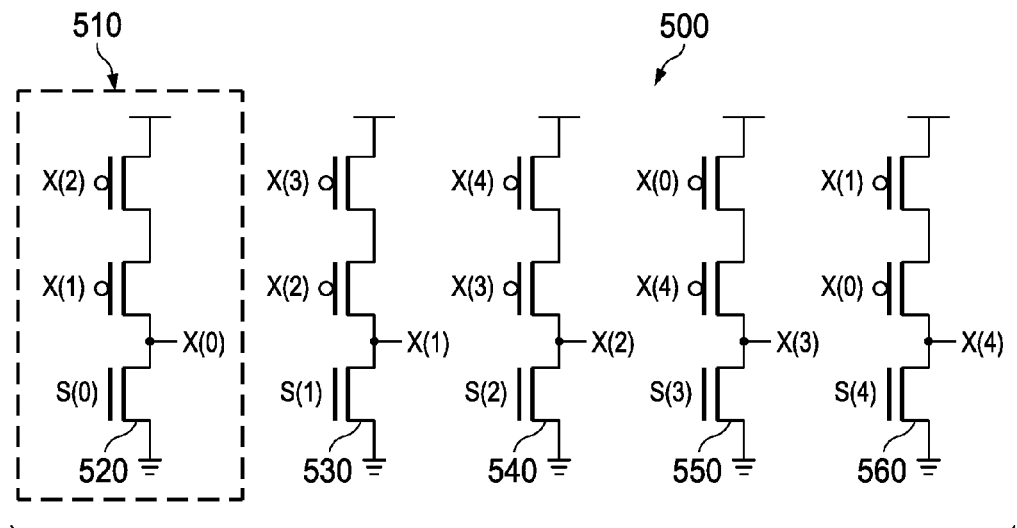
FIG. 5 illustrates an example of a single stage of a level shifting circuit configuration that can be employed with a ring oscillator and capacitive array.
Figure 6:
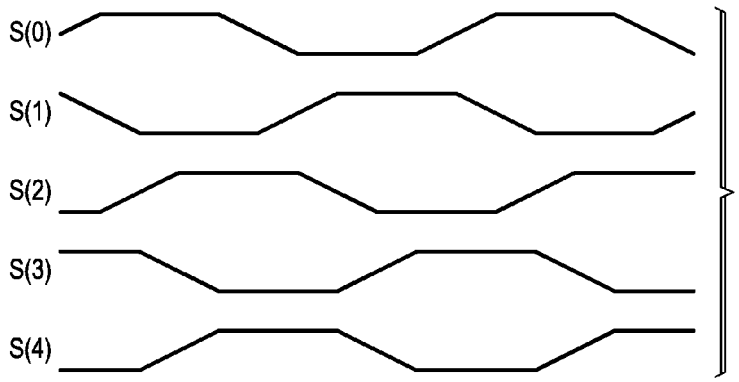
FIG. 6 illustrates an example output waveform from a ring oscillator and capacitive array circuit.

FIG. 5 illustrates an example of a single stage of a level shifting circuit 500 that can be employed with a ring oscillator and capacitive array described herein. The level shifting circuit 500 can be employed to increase the rise and fall time of the outputs from each of the delay stages (or subset thereof) of the ring oscillator and to increase the voltage transition levels of the outputs from each of the delay stages. As noted previously, voltage transition levels refer to the difference between the high and low states of the respective oscillator output signals (e.g., at the output of the respective oscillator delay stage).

Figure 7:
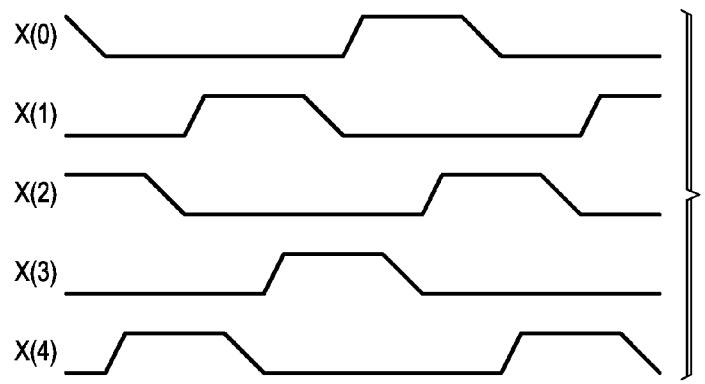
FIG. 7 illustrates an example output waveform from the single stage level shifting circuit configuration depicted in FIG. 5 that is driven from the waveform depicted in FIG. 6.

The level shifting circuit 500 includes at least three series switches such as shown at 510 connected between power and ground for each oscillator output (or subset thereof), where one of the series switches (e.g., switch nearest ground) is driven via the output from at least one of the oscillator delay stages. The level shifting circuit 500 of FIG. 5 can be driven via the example output waveforms S<0> through S<4> shown in FIG. 6 from a ring oscillator and capacitive array circuit as described herein. As shown in the circuit 500, output waveforms S<0> through S<4> drive the input to transistors 520 through 560 which provide a level shifting input for each oscillator stage output. Output from each stage 520 through 560 is shown as X<0> through X<4>. FIG. 7 illustrates an example output waveform for X<0> through X<4> from the single stage level shifting circuit 500 shown in FIG. 5. As shown in FIG. 7, outputs from the level shifter include increased voltage transition levels and decreased rise and fall times from the input waveforms depicted in FIG. 6.

Figure 8:
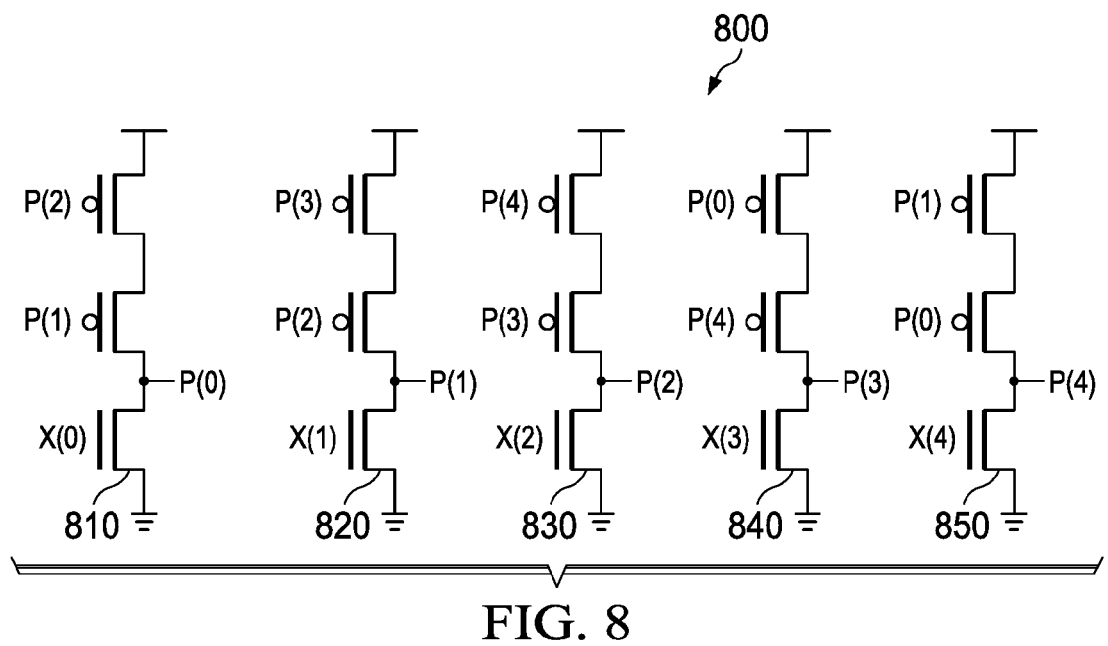
FIG. 8 illustrates an example of an additional stage of a level shifting circuit configuration that can be added to the single stage depicted in FIG. 5.
Figure 9:
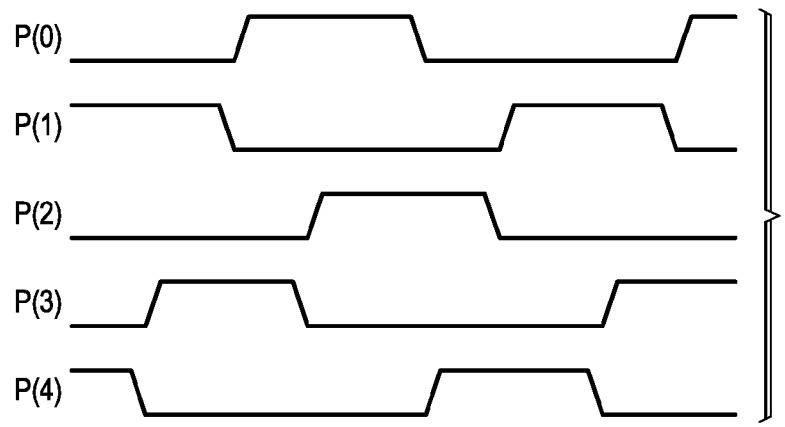
FIG. 9 illustrates an example output waveform from the additional level shifting stage level depicted in FIG. 8 that is driven from the waveform depicted in FIG. 7.

FIG. 8 illustrates an example of an additional stage of a level shifting circuit 800 that can be added to the single stage depicted in FIG. 5. The second level shifting circuit 800 can be driven from the level shifting circuit of FIG. 5 and can be employed to further increase the rise and fall time of the outputs from the level shifting circuit 500 of FIG. 5 and to increase the voltage transition levels of the level shifting circuit 500. The output X<0> through X<4> of the circuit of FIG. 5 drives the input of the circuit 800 shown at 810 though 850. FIG. 9 illustrates an example output waveform P<0> through P<4> from the additional level shifting stage level depicted in the circuit 800 of FIG. 8. Although not shown, additional level shifting stages than the stages depicted in FIGS. 5 and 8 can be employed to further increase transition times and voltage transition levels described herein. The level shifting stage or stages can also be employed in conjunction with the circuit depicted if FIG. 1 to provide increased transition times and levels from the output of the ring oscillator to the analog switching circuits depicted therein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   a ring oscillator that includes a plurality of delay stages coupled in series to generate an output frequency for the ring oscillator, in which the ring oscillator drives at least one phase clock and at least one complimentary phase clock at the output frequency of the ring oscillator, and in which the phase clock and the complimentary phase clock are employed to activate a pair of switches that charge and discharge at least one capacitor configured in a capacitive array to supply power for the delay stages; and
   the capacitive array operatively coupled between a supply rail and a power rail for each of the delay stages to supply the power to the delay stages, wherein the capacitive array selectively adjusts the output frequency of the ring oscillator via a capacitive setting of the capacitive array.

2. The circuit of claim 1, including at least two additional phase clocks and at least two additional switches to charge and discharge the at least one capacitor configured in the capacitive array in a voltage doubling configuration for the supply rail.

3. The circuit of claim 1, including an analog switching circuit that is driven by using the output frequency of the ring oscillator.

4. The circuit of claim 3, in which the analog switching circuit includes at least one of a clocked comparator, an analog to digital converter (ADC), a digital to analog converter (DAC), a direct current (DC)/DC converter, and a linear dropout regulator.

5. The circuit of claim 3, including a controller to monitor an activity rate of the analog switching circuit and to adjust the output frequency of the ring oscillator by adjusting capacitance in the capacitive array based on the activity rate.

6. The circuit of claim 1, including a level shifting circuit to increase a rise and fall time of outputs from each of the delay stages and to increase voltage transition levels of the outputs from the each of the delay stages.

7. The circuit of claim 6, in which the level shifting circuit includes three series switches connected between power and ground, wherein one of the series switches is driven via the output from at least one of the delay stages.

8. The circuit of claim 6, including a second level shifting circuit that is driven from the level shifting circuit to increase a rise and fall time of outputs from the level shifting circuit and to increase voltage transition levels of the level shifting circuit.

9. A circuit comprising:
a ring oscillator that includes a plurality of delay stages coupled in series to generate an output frequency at a respective output of each of the delay stages, in which the ring oscillator generates at least one phase clock and at least one complimentary phase clock at the output frequency of the ring oscillator, and in which the phase clock and the complimentary phase clock are employed to activate a pair of switches that charge and discharge at least one capacitor configured in a capacitive array to supply power for the delay stages;
the capacitive array selectively switched between a supply rail and a power rail for each of the delay stages to supply the power to the delay stages, wherein the capacitive array provides adjustment to a plurality of capacitors in the capacitive array based on a selection command; and
a controller to selectively adjust the output frequency of the ring oscillator by controlling the selection command to adjust the plurality of capacitors in the capacitive array.

10. The circuit of claim 9, including at least two additional phase clocks and at least two additional switches to charge and discharge the capacitor configured in the capacitive array in a voltage doubling configuration for the supply rail.

11. The circuit of claim 9, including an analog switching circuit that is driven by using the output frequency of the ring oscillator.

12. The circuit of claim 11, in which the controller monitors an activity rate of the analog switching circuit and adjusts the output frequency of the ring oscillator by adjusting capacitor values in the capacitive array based on the activity rate.

13. The circuit of claim 9, including a level shifting circuit to increase a rise and fall time of outputs from each of the delay stages and to increase voltage transition levels of the outputs from the each of the delay stages.

14. A circuit comprising:
a ring oscillator that includes a plurality of delay stages coupled in series to generate an output frequency for the ring oscillator;
a capacitive array selectively switched between a supply rail and a power rail for each of the delay stages to supply power to the delay stages, wherein the capacitive array adjusts the output frequency of the ring oscillator via a capacitive setting of the capacitive array;
a level shifter comprising a plurality of switches operatively coupled to a respective output of each of the delay stages, wherein the level shifter increases a rise time and a transition level for the respective output of each of the delay stages; and
a controller that monitors an activity rate of an analog switching circuit and adjusts the output frequency of the ring oscillator by adjusting capacitor values in the capacitive array based on the activity rate.

15. The circuit of claim 14, including an analog switching circuit that is driven by using an output of the level shifter.

* * * * *